US005902641A

United States Patent [19]

Affinito et al.

[11] Patent Number: 5,902,641

[45] Date of Patent: May 11, 1999

[54] FLASH EVAPORATION OF LIQUID MONOMER PARTICLE MIXTURE

[75] Inventors: John D. Affinito, Kennewick; John G. Darab, Richland; Mark E. Gross, Pasco, all of Wash.

[73] Assignee: Battelle Memorial Institute, Richland, Wash.

[21] Appl. No.: 08/939,240

[22] Filed: Sep. 29, 1997

[51] Int. Cl.[6] .................... C23C 16/00

[52] U.S. Cl. .................... 427/255.2

[58] Field of Search .................... 427/255.2, 255.6, 427/255.7, 294, 299, 398.1, 421, 569, 497, 509, 551, 553, 562, 595

[56] References Cited

U.S. PATENT DOCUMENTS

| | | | |
|---|---|---|---|
| 5,260,095 | 11/1993 | Affinito | 427/124 |
| 5,395,644 | 3/1995 | Affinito | 427/124 |
| 5,547,508 | 8/1996 | Affinito | 118/50 |

OTHER PUBLICATIONS

J.D. Affinito, M.E. Gross, C.A.. Coronado, and P.M. Martin, "*Vacuum Deposition Of Polymer Electrolytes On Flexible Substrates*." "Proceedings of the Ninth International Conference on Vacuum Web Coating", Nov. 1995 ed R. Bakish, Bakish Press 1995, pp. 20–36 (No month avail.).

Thin Film Processes, J.L. Vossen, W. Kern, editors, Academic Press, 1978, Part II, Chapter II–1, Glow Discharge Sputter Deposition, pp. 12–63; Part IV, Chapter IV–1 Plasma Deposition of Inorganic Compoundsm and Chapter IV–2 Glow Discharge Polymerization, pp. 335–397 (No month avail.).

Electrical Discharges in Gasses, F.M. Penning, Gordon and Breach Science Publishers, 1965, Chapters 5–6, pp. 19–35, and Chapter 8, pp. 41–50 (no month avail.).

*Primary Examiner*—Bernard Pianalto
*Attorney, Agent, or Firm*—Paul W. Zimmerman

[57] ABSTRACT

The present invention is a method of making a first solid composite polymer layer. The method has the steps of (a) mixing a liquid monomer with particles substantially insoluble in the liquid monomer forming a monomer particle mixture; (b) flash evaporating the particle mixture and forming a composite vapor; and (c) continuously cryocondensing said composite vapor on a cool substrate and cross-linking the cryocondensed film thereby forming the polymer layer.

15 Claims, 3 Drawing Sheets

FLASH EVAPORATION OF LIQUID MONOMER PARTICLE MIXTURE

This invention was made with Government support under contract DE-AC06-76RLO 1830 awarded by the U.S. Department of Energy. The Government has certain rights in the invention.

FIELD OF THE INVENTION

The present invention relates generally to a method of making composite polymer films. More specifically, the present invention relates to making a composite polymer film from a mixture having insoluble particles in a liquid monomer. Additional layers of polymer or metal may be added under vacuum as well. As used herein, the term "(meth)acrylic" is defined as "acrylic or methacrylic". As used herein, the term "cryocondense" and forms thereof refers to the physical phenomenon of a phase change from a gas phase to a liquid phase upon the gas contacting a surface having a temperature lower than a dew point of the gas.

BACKGROUND OF THE INVENTION

The basic process of flash evaporation is described in U.S. Pat. No. 4,954,371 herein incorporated by reference. This basic process may also be referred to as polymer multi-layer (PML) flash evaporation. Briefly, a polymerizable and/or cross linkable material is supplied at a temperature below a decomposition temperature and polymerization temperature of the material. The material is atomized to droplets having a droplet size ranging from about 1 to about 50 microns. The droplets are then vaporized, under vacuum by contact with a heated surface above the boiling point of the material, but below the temperature which would cause pyrolysis. The vapor is cryocondensed then polymerized or cross linked as a very thin polymer layer.

Many electronic devices, however, require polymer composite layers for devices including but not limited to molecularly doped polymers (MDP), light emitting polymers (LEP), and light emitting electrochemical cells (LEC). Presently these devices are made by spin coating or physical vapor deposition (PVD). Physical vapor deposition may be either evaporation or sputtering. Spin coating, surface area coverage is limited and scaling up to large surface areas requires multiple parallel units rather than a larger single unit. Moreover, physical vapor deposition processes are susceptible to pin holes.

Therefore, there is a need for an apparatus and high deposition rate method for making composite polymer layers that may be scaled up to cover larger surface areas with a single unit and that is less susceptible to pin holes.

SUMMARY OF THE INVENTION

The present invention is a method of making a first solid composite polymer layer. The method has the steps of:

(a) mixing a liquid monomer with particles substantially insoluble in the liquid monomer forming a monomer particle mixture;

(b) supplying a continuous liquid flow of said monomer particle mixture into a vacuum environment at a temperature below both the decomposition temperature and the polymerization temperature of the monomer particle mixture;

(c) continuously atomizing the monomer particle mixture into a continuous flow of droplets;

(d) continuously vaporizing the droplets by continuously contacting the droplets on a heated surface having a temperature at or above a boiling point of the liquid monomer and of the particles, but below a pyrolysis temperature, forming a composite vapor; and (e) continuously cryocondensing said composite vapor on a cool substrate thereby forming said composite polymer layer.

It is, therefore, an object of the present invention to provide a method of making a composite polymer via flash evaporation.

An advantage of the present invention is that it is permits making composite layers via flash evaporation. Another advantage of the present invention is that multiple layers of materials may be combined. For example, as recited in U.S. Pat. Nos. 5,547,508 and 5,395,644, 5,260,095, hereby incorporated by reference, multiple polymer layers, alternating layers of polymer and metal, and other layers may be made with the present invention in the vacuum environment.

The subject matter of the present invention is particularly pointed out and distinctly claimed in the concluding portion of this specification. However, both the organization and method of operation, together with further advantages and objects thereof, may best be understood by reference to the following detailed description in combination with the drawings wherein like reference characters refer to like elements.

DESCRIPTION OF THE PREFERRED EMBODIMENT(S)

Figure 1:
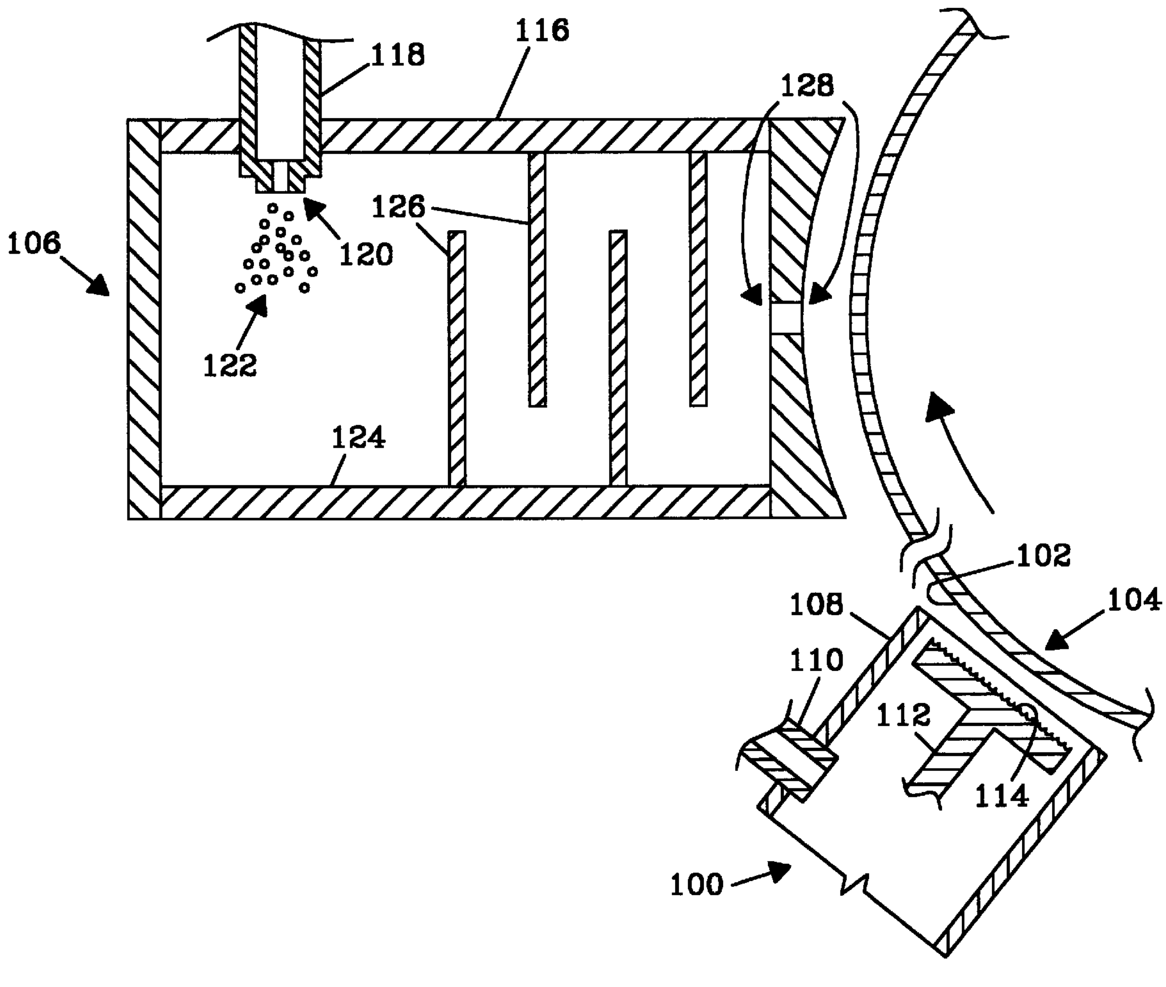
Fig. 1 (PRIOR ART)
FIG. 1 is a cross section of a prior art combination of a glow discharge plasma generator with inorganic compounds with flash evaporation.

According to the present invention, a first solid polymer composite layer is made by the steps of:

(a) mixing a liquid monomer with particles substantially insoluble in the liquid monomer forming a monomer particle mixture;

(b) flash evaporating the monomer particle mixture forming a composite vapor; and (c) continuously cryocondensing the composite vapor on a cool substrate and cross linking a cryocondensed monomer layer thereby forming the composite polymer layer.

Flash evaporation has the steps:

(a) supplying a continuous liquid flow of said monomer particle mixture into a vacuum environment at a temperature below both the decomposition temperature and the polymerization temperature of the monomer particle mixture;

(b) continuously atomizing the monomer particle mixture into a continuous flow of droplets;

(c) continuously vaporizing the droplets by continuously contacting the droplets on a heated surface having a temperature at or above a boiling point of the liquid monomer and of the particles, but below a pyrolysis temperature, forming a composite vapor.

Insoluble is defined as not dissolving. Substantially insoluble refers to any amount of a particle material not dissolved in the liquid monomer. Examples include solid particles that are insoluble or partially soluble in the liquid monomer, immiscible liquids that are fully or partially miscible/insoluble in the liquid monomer, and dissolvable solids that have a concentration greater than the solubility limit of the monomer so that an amount of the dissolvable solid remains undissolved.

The liquid monomer may be any liquid monomer useful in flash evaporation for making polymer films. Liquid monomer includes but is not limited to acrylic monomer, for example tripropyleneglycol diacrylate, tetraethylene glycol diacrylate, tripropylene glycol monoacrylate, caprolactone acrylate and combinations thereof; methacrylic monomers; and combinations thereof. The (meth)acrylic monomers are particularly useful in making molecularly doped polymers (MDP), light emitting polymers (LEP), and light emitting electrochemical cells (LEC).

The insoluble particle may be any insoluble or partially insoluble particle type having a boiling point below a temperature of the heated surface in the flash evaporation process. For LEP/LEC devices, preferred insoluble particles are organic compounds including but not limited to N,N'-Bis(3-methylphenyl)-N,N'-diphenylbenzidine (TPD)—a hole transporting material for LEP and MDP, and Tris(8-quinolinolato) aluminumIII (Alq3)—an electron transporting and light emitting material for LEP and MDP. To achieve an LEC, it is necessary to add an electrolyte, usually a salt for example Bistrifluoromethylsulfonyl imide, Lithium-trifluoromethanesulfonate ($CF_3SO_3Li$), and combinations thereof.

The insoluble particles are preferably of a volume much less than about 5000 cubic micrometers (diameter about 21 micrometers) or equal thereto, preferably less than or equal to about 4 cubic micrometers (diameter about 2 micrometers). In a preferred embodiment, the insoluble particles are sufficiently small with respect to particle density and liquid monomer density and viscosity that the settling rate of the particles within the liquid monomer is several times greater than the amount of time to transport a portion of the particle liquid monomer mixture from a reservoir to the atomization nozzle. It is to be noted that it may be necessary to stir the particle liquid monomer mixture in the reservoir to maintain suspension of the particles and avoid settling.

The mixture of monomer and insoluble or partially soluble particles may be considered a slurry, suspension or emulsion, and the particles may be solid or liquid. The mixture may be obtained by several methods. One method is to mix insoluble particles of a specified size into the monomer. The insoluble particles of a solid of a specified size may be obtained by direct purchase or by making them by one of any standard techniques, including but not limited to milling from large particles, precipitation from solution, melting/spraying under controlled atmospheres, rapid thermal decomposition of precursors from solution as described in U.S. Pat. No. 5,652,192 hereby incorporated by reference. The steps of U.S. Pat. No. 5,652,192 are making a solution of a soluble precursor in a solvent and flowing the solution through a reaction vessel, pressurizing and heating the flowing solution and forming substantially insoluble particles, then quenching the heated flowing solution and arresting growth of the particles. Alternatively, larger sizes of solid material may be mixed into liquid monomer then agitated, for example ultrasonically, to break the solid material into particles of sufficient size.

Liquid particles may be obtained by mixing an immiscible liquid with the monomer liquid and agitating by ultrasonic or mechanical mixing to produce liquid particles within the liquid monomer. Immiscible liquids include, for example fluorinated monomers.

Upon spraying, the droplets may be particles alone, particles surrounded by liquid monomer and liquid monomer alone. Since both the liquid monomer and the particles are evaporated, it is of no consequence either way. It is, however, important that the droplets be sufficiently small that they are completely vaporized. Accordingly, in a preferred embodiment, the droplet size may range from about 1 micrometer to about 50 micrometers.

EXAMPLE 1

A first solid polymer layer was made according to the method of the present invention. Specifically, the acrylic monomer blend of 50.75 ml of tetraethyleneglycol diacrylate plus 14.5 ml tripropyleneglycolmonoacrylate plus 7.25 ml caprolactoneacrylate plus 10.15 ml acrylic acid plus 10.15 ml of EZACURE (a benzophenone blend photo initiator sold by Sartomer Corporation of Exton, Pa.) was mixed with 36.25 gm of particles of solid N,N'-Bis(3-methylphenyl)-N,N'-diphenylbenzidine having a wide range of particle sizes varying from very fine to the size of grains of sand. The mixture was then agitated with a 20 kHz ultrasonic tissue mincer for about one hour to break up the solid particles to form a fine suspension. The initial mixture/suspension having about 40 vol %, or 72.5 gm, of particles was found to plug the 0.051 inch spray nozzle, so the mixture was diluted to about 20 vol %, or 36.25 gm, to avoid plugging. It will be apparent to one of skill in the art of slurry/suspension flow that increasing nozzle size may accommodate higher concentrations. The mixture was heated to about 45° C. and stirred to prevent settling. The mixture was pumped through a capillary tube of 0.08" I.D. and about 24" long to the spray nozzle of 0.051 inch which atomized (ultrasonic atomizer at 25 kHz) the mixture into droplets that fell upon a surface maintained at about 650° F. Flash evaporation chamber walls were maintained at about 550° F. to prevent monomer cryocondensation on the flash evaporation chamber walls. The vapor cryocondensed on a polyester (PET) web maintained at a low temperature with cooling water introduced at a temperature of about 55° F., followed by UV curing.

The cured polymer was transparent and deposited at rates of about 4 microns thick at 4 m/min. Rates of hundreds of meters/minute are achievable though.

EXAMPLE 2

A first solid polymer layer was made according to the method of the present invention and with the parameters specified in Example 1, with the following exceptions. The solid particles were 19.5 gm (about 10.75 vol %) of Tris(8-quinolinolato)-aluminumIII consisting of a few solid chunks in excess of 0.25" across. The capillary tube was 0.032" I.D. and about 24" long to the spray nozzle.

The cured polymer was produced at a rate of about 4 microns thick at 4 m/min.

EXAMPLE 3

An experiment was conducted as in Examples 1 and 2, but using a combination of the mixtures from Example 1 and Example 2 along with 5 gm of an electrolyte salt Bistrifluoro-methylsulfonyl imide.

The cured polymer was clear and produced at a rate of about 4 microns thick at 1 m/min.

ALTERNATIVE EMBODIMENTS

The method of the present invention may obtain a polymer layer either by radiation curing or by self curing. In radiation curing (FIG. 1), the monomer liquid may include a photoinitiator. A flash evaporator 106 in a vacuum environment or chamber is used to deposit a monomer layer on a surface 102 of a substrate 104. In addition an e-beam gun or ultraviolet light (not shown) is provided downstream of the flash evaporation unit for cross linking or curing the cryocondensed monomer layer. A glow discharge plasma unit 100 may be used to etch the surface 102. The glow discharge plasma unit 100 has a housing 108 surrounding an electrode 112 that may be smooth or may have pointed projections 114. An inlet 110 permits entry of a gas for etching, for example oxygen or argon. In self curing, a combined flash evaporator, glow discharge plasma generator is used without either the e-beam gun or ultraviolet light.

Figure 2:
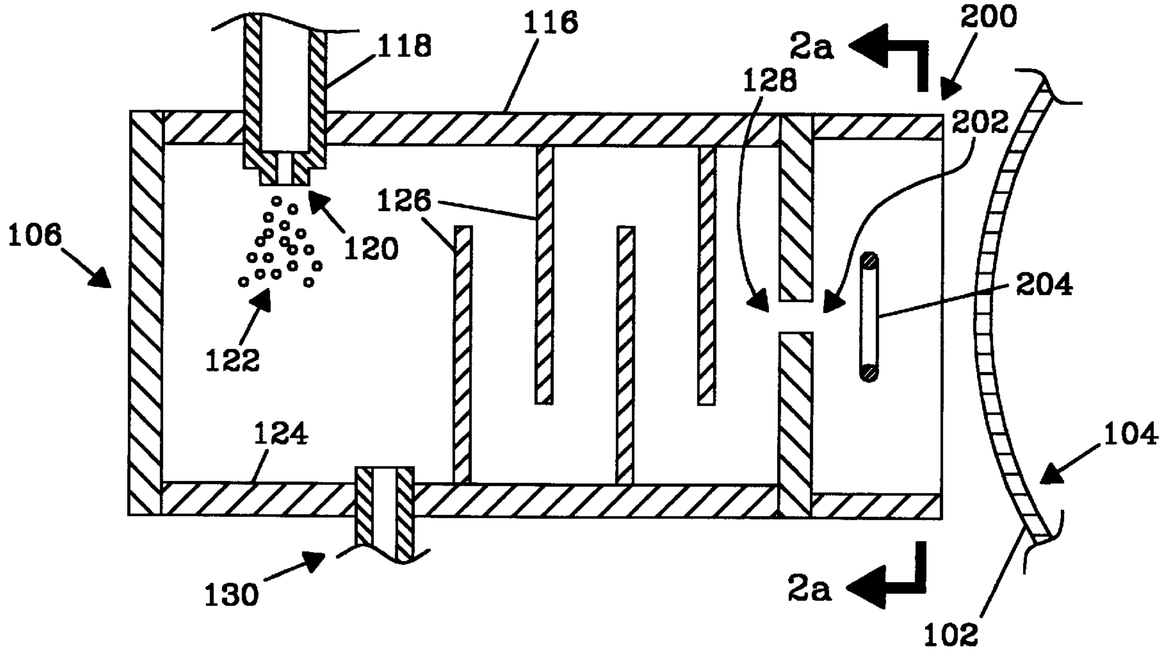
FIG. 2 is a cross section of the apparatus of the present invention of combined flash evaporation and glow discharge plasma deposition.

A self curing apparatus is shown in FIG. 2. The apparatus and method of the present invention are preferably within a low pressure (vacuum) environment or chamber. Pressures preferably range from about $10^{-1}$ torr to $10^{-6}$ torr. The flash evaporator 106 has a housing 116, with a monomer inlet 118 and an atomizing nozzle 120. Flow through the nozzle 120 is atomized into particles or droplets 122 which strike the heated surface 124 whereupon the particles or droplets 122 are flash evaporated into a gas, evaporate or composite vapor that flows past a series of baffles 126 to a composite vapor outlet 128 and cryocondenses on the surface 102. Cryocondensation on the baffles 126 and other internal surfaces is prevented by heating the baffles 126 and other surfaces to a temperature in excess of a cryocondensation temperature or dew point of the composite vapor. Although other gas flow distribution arrangements have been used, it has been found that the baffles 126 provide adequate gas flow distribution or uniformity while permitting ease of scaling up to large surfaces 102. The composite vapor outlet 128 directs gas toward a glow discharge electrode 204 creating a glow discharge plasma from the composite vapor. In the embodiment shown in FIG. 2, the glow discharge electrode 204 is placed in a glow discharge housing 200 having a composite vapor inlet 202 proximate the composite vapor outlet 128. In this embodiment, the glow discharge housing 200 and the glow discharge electrode 204 are maintained at a temperature above a dew point of the composite vapor. The glow discharge plasma exits the glow discharge housing 200 and cryocondenses on the surface 102 of the substrate 104. The glow discharge monomer plasma cryocondensing on a substrate and thereon, wherein the crosslinking results from radicals created in the glow discharge plasma and achieves self curing. It is preferred that the substrate 104 is cooled. In this embodiment, the substrate 104 is moving and may be non-electrically conductive, conductive, or biased with an impressed voltage.

Figure 2A:
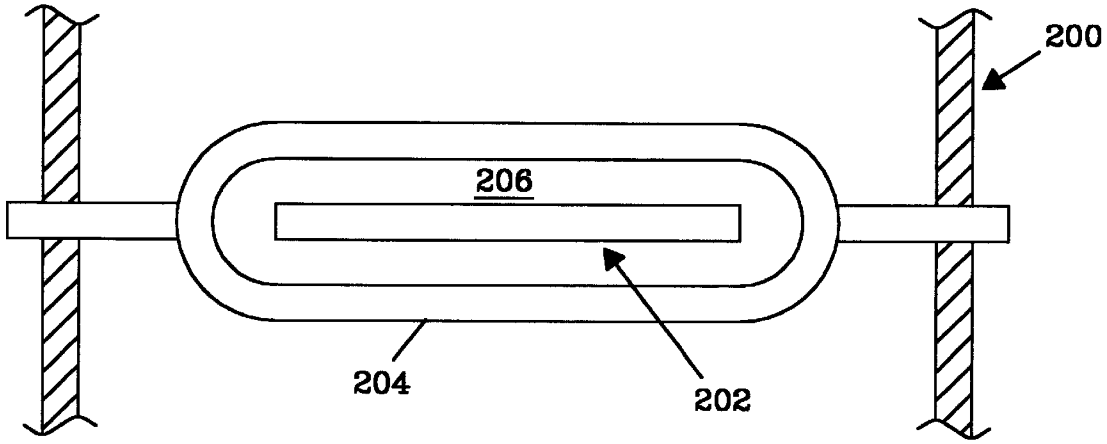
FIG. 2*a* is a cross section end view of the apparatus of the present invention.

A preferred shape of the glow discharge electrode 204 is shown in FIG. 2*a*. In this preferred embodiment, the glow discharge electrode 204 is shaped so that composite vapor flow from the composite vapor inlet 202 substantially flows through an electrode opening 206. Any electrode shape can be used to create the glow discharge, however, the preferred shape of the electrode 204 does not shadow the plasma from the composite vapor, and its symmetry, relative to the monomer exit slit 202 and substrate 204, provides uniformity of the plasma across the width of the substrate while uniformity transverse to the width follows from the substrate motion.

The spacing of the electrode 204 from the substrate 104 is a gap or distance that permits the plasma to impinge upon the substrate. This distance that the plasma extends from the electrode will depend on the evaporate species, electrode 204/substrate 104 geometry, electrical voltage and frequency, and pressure in the standard way as described in detail in ELECTRICAL DISCHARGES IN GASSES, F. M. Penning, Gordon and Breach Science Publishers, 1965, and summarized in THIN FILM PROCESSES, J. L. Vossen, W. Kern, editors, Academic Press, 1978, Part II, Chapter II-1, Glow Discharge Sputter Deposition, both hereby incorporated by reference.

Figure 3:
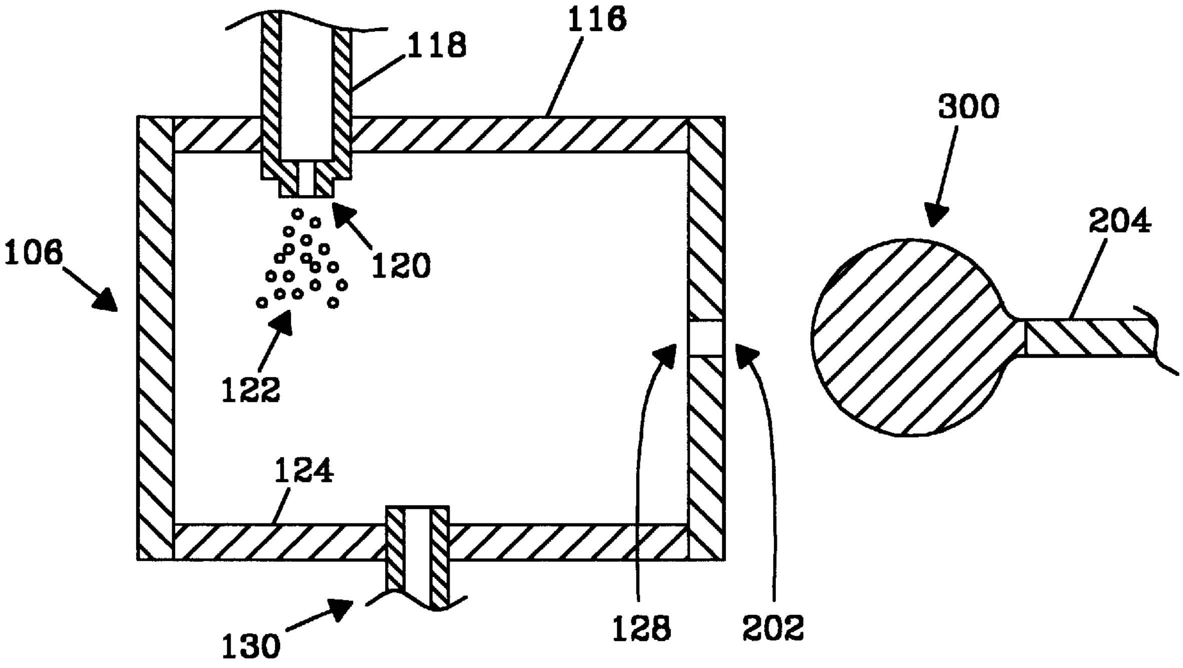
FIG. 3 is a cross section of the present invention wherein the substrate is the electrode.

An apparatus suitable for batch operation is shown in FIG. 3. In this embodiment, the glow discharge electrode 204 is sufficiently proximate a part 300 (substrate) to permit the plasma to impinge upon the substrate 300. This distance that the plasma extends from the electrode will depend on the evaporate species, electrode 204/substrate 104 geometry, electrical voltage and frequency, and pressure in the standard way as described in ELECTRICAL DISCHARGES IN GASSES, F. M. Penning, Gordon and Breach Science Publishers, 1965, hereby incorporated by reference. Thus, the part 300 is coated with the monomer condensate and self cured into a polymer layer. Sufficiently proximate may be connected to, resting upon, in direct contact with, or separated by a gap or distance. This distance that the plasma extends from the electrode will depend on the evaporate species, electrode 204/substrate 104 geometry, electrical voltage and frequency, and pressure in the standard way as described in ELECTRICAL DISCHARGES IN GASSES, F. M. Penning, Gordon and Breach Science Publishers, 1965. It is preferred, in this embodiment, that the substrate 300 be non-moving or stationary during cryocondensation. However, it may be advantageous to rotate the substrate 300 or laterally move it for controlling the thickness and uniformity of the monomer layer cryocondensed thereon. Because the cryocondensation occurs rapidly, within seconds, the part may be removed after coating and before it exceeds a coating temperature limit.

In operation, either as a method for plasma enhanced chemical vapor deposition of high molecular weight monomeric materials onto a substrate, or as a method for making self-curing polymer layers (especially polymer multi-layer (PML)), the composite polymer may be formed by cryocondensing the glow discharge composite monomer plasma on a substrate and crosslinking the glow discharge plasma thereon. The crosslinking results from radicals created in the glow discharge plasma thereby permitting self curing.

The liquid monomer may be any liquid monomer useful in flash evaporation for making polymer films. When using the apparatus of FIG. 2 to obtain self curing, It is preferred that the monomer material or liquid have a low vapor pressure, preferably less than about 10 torr at 83° F. (28.3° C.), more preferably less than about 1 torr at 83° F. (28.3° C.), and most preferably less than about 10 millitorr at 83° F. (28.3° C.). For monomers of the same chemical family, monomers with low vapor pressures usually also have higher molecular weight and are more readily cryocondensible than lower vapor pressure, lower molecular weight monomers. Low vapor pressure monomers are more readily cryocondensible than low molecular weight monomers.

By using flash evaporation, the monomer is vaporized so quickly that reactions that generally occur from heating a liquid monomer to an evaporation temperature simply do not occur.

In addition to the evaporate from the liquid monomer, additional gases may be added within the flash evaporator 106 upstream of the evaporate outlet 128, preferably between the heated surface 124 and the first baffle 126 nearest the heated surface 124. Additional gases may be organic or inorganic for purposes included but not limited to ballast, reaction and combinations thereof. Ballast refers to providing sufficient molecules to keep the plasma lit in circumstances of low evaporate flow rate. Reaction refers to chemical reaction to form a compound different from the evaporate. Ballast gases include but are not limited to group VIII of the periodic table, hydrogen, oxygen, nitrogen, chlorine, bromine, polyatomic gases including for example carbon dioxide, carbon monoxide, water vapor, and combinations thereof. An exemplary reaction is by addition of oxygen gas to the monomer evaporate hexamethylydisiloxane to obtain silicon dioxide.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method of making a first solid composite polymer layer, comprising the steps of:

(a) mixing a liquid monomer with particles substantially insoluble in the liquid monomer forming a monomer particle mixture;

(b) supplying a continuous liquid flow of said monomer particle mixture into a vacuum environment at a temperature below both the decomposition temperature and the polymerization temperature of the monomer particle mixture;

(c) continuously atomizing the monomer particle mixture into a continuous flow of droplets;

(d) continuously vaporizing the droplets by continuously contacting the droplets on a heated surface having a temperature at or above a boiling point of the liquid monomer and of the particles, but below a pyrolysis temperature, forming a composite vapor; and (e) continuously cryocondensing said composite vapor on a cool substrate and cross linking a cryocondensed monomer layer thereby forming said polymer layer.

2. The method as recited in claim 1, wherein the liquid monomer is selected from the group consisting of (meth) acrylic monomers and combinations thereof.

3. The method as recited in claim 1, wherein acrylic monomer is selected from the group consisting of tripropyleneglycol diacrylate, tetraethylene glycol diacrylate, tripropylene glycol monoacrylate, caprolactone acrylate, and combinations thereof.

4. The method as recited in claim 1, wherein the particles are selected from the group consisting of organic solids, liquids, and combinations thereof.

5. The method as recited in claim 4, wherein the organic solids are selected from the group consisting of N,N'-Bis(3-methylphenyl)-N,N'-diphenylbenzidine, Tris(8-quinolinolato)aluminumIII, and combinations thereof.

6. The method as recited in claim 1, wherein said cross linking is radiation cross linking.

7. The method as recited in claim 1, further comprising the step of passing the composite vapor past a glow discharge electrode prior to cryocondensing, wherein said cross linking is self curing.

8. The method as recited in claim 1, further comprising adding an additional gas to the composite vapor upstream of a composite vapor outlet of a flash evaporator.

9. The method as recited in claim 8, wherein said additional gas is a ballast gas.

10. The method as recited in claim 8, wherein said additional gas is a reaction gas.

11. The method as recited in claim 10, wherein a reaction gas is oxygen gas and the composite vapor includes hexamethylydisiloxane.

12. A method of making a first solid composite polymer layer, comprising the steps of:

(a) mixing a liquid monomer with particles substantially insoluble in the liquid monomer forming a monomer particle mixture;

(b) flash evaporating said monomer particle mixture in a vacuum environment forming a composite vapor; and (c) continuously cryocondensing said composite vapor on a cool substrate and cross linking a cryocondensed monomer layer thereby forming said polymer layer.

13. The method as recited in claim 12, wherein flash evaporating comprises the steps of:

(a) supplying a continuous liquid flow of said monomer particle mixture into a vacuum environment at a temperature below both the decomposition temperature and the polymerization temperature of the monomer particle mixture;

(b) continuously atomizing the monomer particle mixture into a continuous flow of droplets;

(c) continuously vaporizing the droplets by continuously contacting the droplets on a heated surface having a temperature at or above a boiling point of the liquid monomer and of the particles, but below a pyrolysis temperature, forming said composite vapor.

14. The method as recited in claim 12, wherein said cross linking is radiation cross linking.

15. The method as recited in claim 12, further comprising the step of passing the composite vapor past a glow discharge electrode prior to cryocondensing, wherein said cross linking is self curing.

* * * * *